(12) United States Patent     (10) Patent No.: US 7,568,669 B2
Siepierski et al.     (45) Date of Patent: Aug. 4, 2009

(54) DOCKING STATION FOR ELECTRONIC MODULE

(75) Inventors: Richard Michael Siepierski, Livonia, MI (US); Douglas Christian Lipp, Ann Arbor, MI (US); Jeffery Michael Antoun, Canton, MI (US)

(73) Assignee: Yazaki North America, Inc., Canton, MI (US)

( * ) Notice: Subject to any disclaimer, the term of this patent is extended or adjusted under 35 U.S.C. 154(b) by 222 days.

(21) Appl. No.: 11/067,802

(22) Filed: Feb. 28, 2005

(65) Prior Publication Data

US 2006/0278806 A1    Dec. 14, 2006

(51) Int. Cl.
*F16M 11/00* (2006.01)
(52) U.S. Cl. .................. 248/201; 361/683; 361/685
(58) Field of Classification Search ............. 248/200, 248/201, 675; 361/686, 683
See application file for complete search history.

(56) References Cited

U.S. PATENT DOCUMENTS

| | | | | |
|---|---|---|---|---|
| 1,137,773 | A * | 5/1915 | Marsden | 362/652 |
| 1,258,827 | A * | 3/1918 | Todd | 362/295 |
| 2,460,903 | A * | 2/1949 | Peck | 361/513 |
| 2,920,340 | A * | 1/1960 | Hopkins | 16/248 |
| 2,954,199 | A * | 9/1960 | Greer | 248/201 |
| 3,695,568 | A | 10/1972 | Hogrebe | |
| 4,747,570 | A | 5/1988 | Takahashi | |
| 5,480,115 | A | 1/1996 | Haltof | |
| 5,894,941 | A | 4/1999 | Woodruff | |
| 5,947,435 | A | 9/1999 | Small | |
| 6,236,563 | B1 | 5/2001 | Buican et al. | |
| 6,262,888 | B1 * | 7/2001 | Siedow et al. | 361/685 |
| 6,549,416 | B2 * | 4/2003 | Sterner et al. | 361/727 |
| 6,574,117 | B1 | 6/2003 | Lebo | |
| 6,657,868 | B1 | 12/2003 | Hsue | |
| 6,961,237 | B2 * | 11/2005 | Dickie | 361/683 |
| 2002/0047137 | A1 | 4/2002 | Arimoto et al. | |

\* cited by examiner

*Primary Examiner*—Gwendolyn Baxter
(74) *Attorney, Agent, or Firm*—Dickinson Wright PLLC

(57) ABSTRACT

An apparatus for securing a module in a fixed position is disclosed. The apparatus includes at least two guidance mechanisms, which are used to direct the module into the proper position during its insertion into the apparatus. The apparatus also includes a securing mechanism, which secures the module in position during the assembly process, and a locking mechanism, which locks the module to the apparatus.

4 Claims, 3 Drawing Sheets

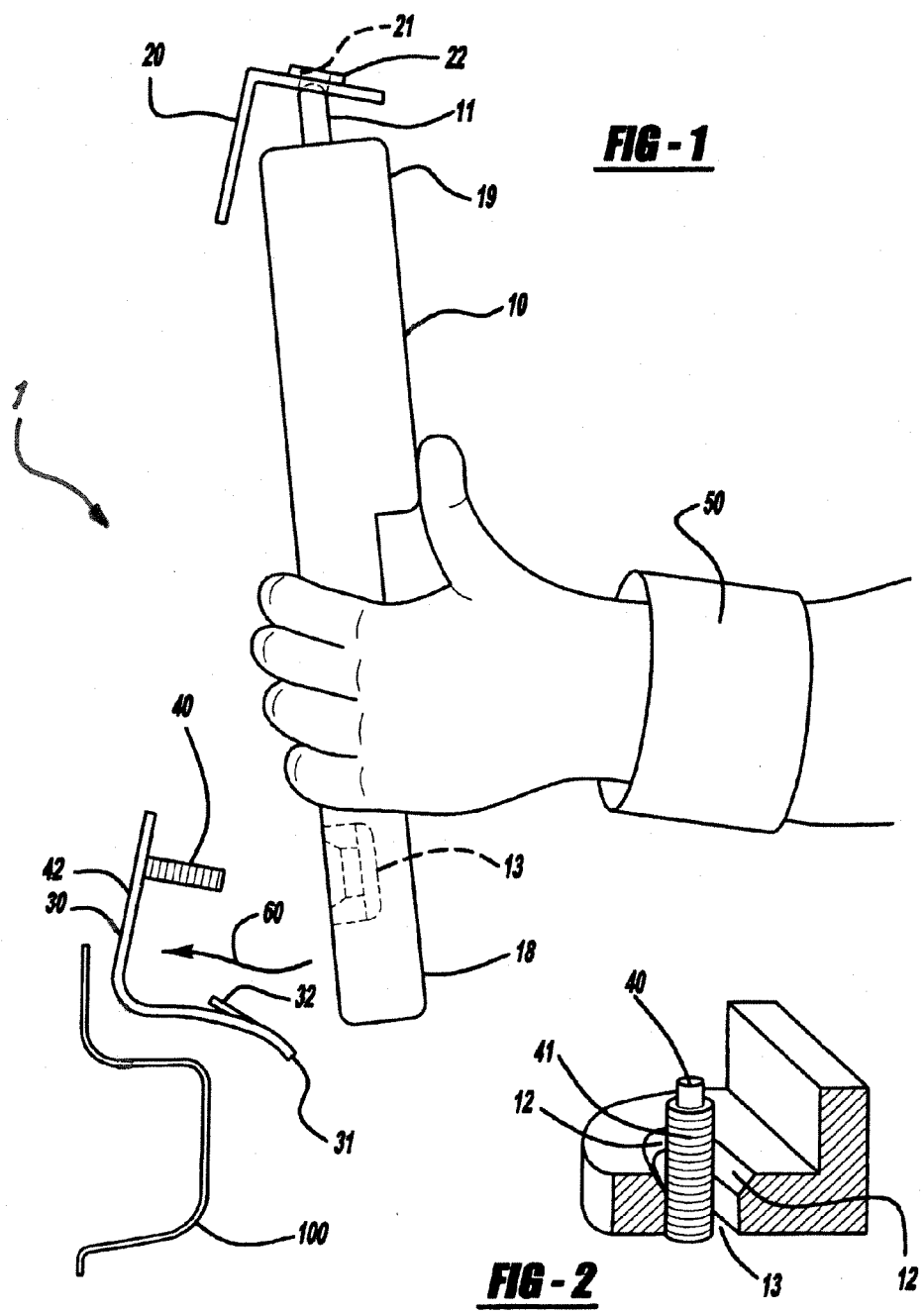

DOCKING STATION FOR ELECTRONIC MODULE

BACKGROUND OF THE INVENTION

The present invention relates to an apparatus for securing a module in a fixed position. More specifically, the invention is directed to a bracket which receives a module, preferably an electronic module, and fixedly secures that module in position. As more fully described below, the present invention allows for an electronic module to be easily inserted into, and removable from, a precise position and further secured in a fixed state with a secondary securing mechanism.

Mechanisms for securing electronic modules in a fixed position are well known in the art. For example, as shown in U.S. Pat. No. 6,657,868, an electronic module may be secured in a fixed position by utilizing a mounting assembly which is secured to the electronic module by fasteners, and then securing the mounting assembly to a fixed base member by additional fasteners. A complex mechanism for securing an electronic module in a fixed position, which includes a swinging lever and the use of intermediate positions while inserting the module, is disclosed in U.S. Pat. No. 5,947,435.

Each of the mechanisms described above has disadvantages. For example, the apparatus disclosed in U.S. Pat. No. 6,657,868 includes numerous assembly steps and the use of multiple fasteners to be attached to both the bracket and module. The apparatus in U.S. Pat. No. 5,947,435 is complex with many moving parts and requires that the module be put into at least one intermediate assembly position before being secured into a final fixed position. Additionally, both of these apparatuses are ill-suited for securing a module in a confined space.

Accordingly, there exists a need for a simple apparatus for securing an electronic module in a fixed position. Further, there is a need for a securing system that allows a module to be inserted into, and removed from, a fixed position with a high degree of precision and with a relatively small number of simple assembly steps, even in a confined space.

SUMMARY OF THE INVENTION

According to one embodiment of the present invention, an apparatus for securing a module is disclosed. The apparatus includes a first bracket member portion having a first guidance apparatus and a second bracket member portion having a second guidance apparatus. The second bracket member portion further includes a securing mechanism that is capable of retaining the module in a fixed position. The first and second guidance apparatuses direct the module into a proper position while the module is inserted into the apparatus. The apparatus also includes a locking mechanism that locks the module in a final fixed position.

In another embodiment of the present invention, a bracket for securing a module is disclosed. The bracket includes two guidance devices, one each to direct opposing ends of the module when it is being inserted into the bracket. The bracket further includes a securing mechanism that secures the module in the inserted position. Additionally, the bracket includes a locking mechanism that is used to lock the bracket in the final fixed position.

One advantage of the present invention over the prior art is the ease with which the module is finally locked in its proper position. Another advantage of the present invention is the ability to secure modules in a precise fixed position with relatively little skill, even in confined areas. Further scope of applicability of the present invention will become apparent from the following detailed description, claims, and drawings. However, it should be understood that the detailed description and specific examples, while indicating preferred embodiments of the invention, are given by way of illustration only, since various changes and modifications within the spirit and scope of the invention will become apparent to those skilled in the art.

BRIEF DESCRIPTION OF THE DRAWINGS

The present invention will become more fully understood from the detailed description given here below, the appended claims, and the accompanying drawings in which:

FIG. 1 is a side view of the securing apparatus and module according to one embodiment of the present invention.

FIG. 2 is a zoom view of locking mechanism of FIG. 1.

DETAILED DESCRIPTION OF THE PREFERRED EMBODIMENT

Figure 3:
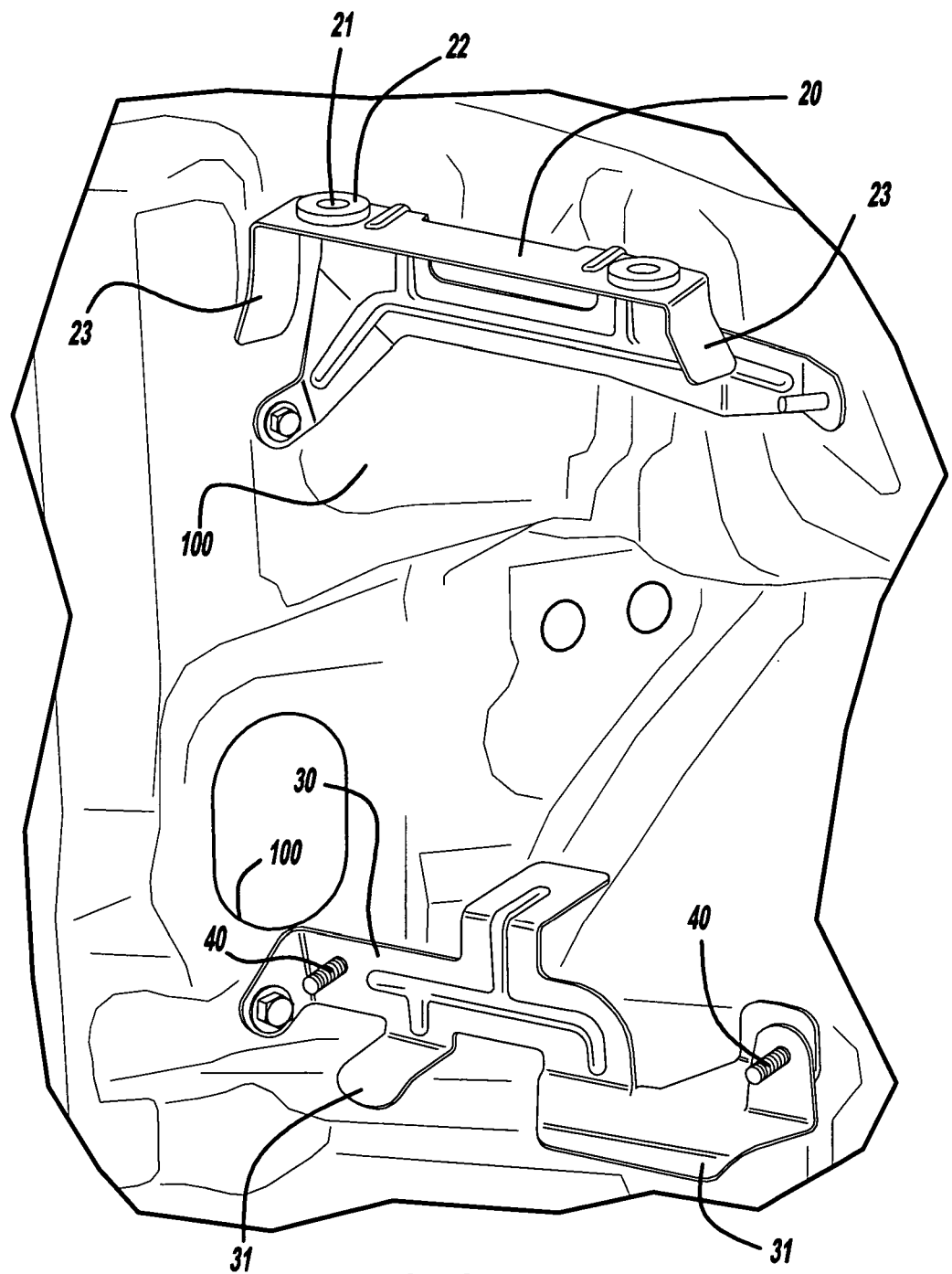
FIG. 3 is an elevational perspective view of the securing apparatus according to one embodiment of the present invention.

Referring to FIG. 1, an exemplary embodiment of a docking station for an electronic module according to the present invention is depicted. An electronic module 10 is shown being inserted into the docking station 1. The docking station 1 comprises an upper bracket portion 20 and a lower bracket portion 30. In a preferred embodiment, the two bracket portions 20 and 30 comprise two separate members, however it is within the scope of the invention to integrate the two bracket portions into one contiguous member. The bracket portions 20 and 30 are preferably made of a stiff material, e.g., steel or glass filled polymer, that is resistant to plastic deformation.

The upper bracket portion 20 includes a guiding mechanism. The guiding mechanism is designed to direct the electronic module 10 into the proper inserted position during the installation of the electronic module 10 into the docking station 1. In the preferred embodiment illustrated in FIG. 1, the guiding mechanism includes guidance holes 21 and, disposed within the guidance holes 21, grommets 22, preferably made of a rubber-like material. The guidance holes 21 and grommets 22 are arranged to interact with guiding studs 11 on the electronic module 10 during the module insertion process, further described below.

In a preferred embodiment, the guiding mechanism also provides the functionality of securing one end of the module 10 into the docking station. In the illustrated example, the guiding holes 21 and grommets 22 secure the top portion 19 of the module 10 into the bracket 1. The guiding studs 11, once inserted in the guidance holes 21, prohibit movement of the module 10 in the lateral direction. Additionally, the grommets 22 provide a degree of security by inhibiting removal of the guiding studs 11 from the guidance holes 21 either by frictional interaction or by a snapping insertion of a tab on the guiding studs 11, as is well known in the art.

The lower bracket portion 30 includes both a guiding mechanism and a securing mechanism. In the preferred embodiment illustrated in FIG. 1, the guiding mechanism comprises a ramp assembly 31 that directs the lower portion 18 of the module 10 into the bracket 20 (in FIG. 1, in the up direction). During the module insertion process described below, the guiding mechanism directs the lower portion 18 of the module 10 into the inserted position and, when the module 10 reaches the inserted position, the securing mechanism automatically fixes the module 10 in position. The securing mechanism may be integrated with the guiding mechanism, illustrated in FIG. 1 as the retaining lip 32 on the ramp assembly 31.

A locking assembly is provided with the docking station in order to lock the module 10 into the inserted or fixed position. In the embodiment illustrated in FIG. 1, the locking assembly comprises a locking stud 40. The locking stud 40 protrudes through an opening 13 in the module 10 when in the fixed position. In the preferred embodiment, the locking stud 40 includes a ratcheting mechanism 41, illustrated in FIG. 2, which allows for easy insertion of the locking stud 40 into the opening 13, but inhibits the removal of the locking stud 40 once inserted. In this embodiment, the locking assembly also provides the functionality of the securing mechanism described above with respect to the lower bracket portion 30, therefore both the ramp assembly 31 and the ratcheting mechanism 41 integral with the locking stud 40 are used to secure the module 10 in the fixed position during insertion. Once the module 10 is secured in the fixed position, a nut (not shown) is screwed onto the locking stud 40 in order to lock the module 10 between the nut and the base 42 of the locking stud 40. Preferably, the locking stud 40 is integrated with the lower bracket portion 30.

The opening 13 in the module 10 preferably includes a chamfered edge 12 that guides the locking stud 40 into the proper position with respect to the module 10. In this manner, the module 10 is further directed to the proper fixed position during installation. In this manner, the locking stud 40 and its ratcheting mechanism 41 interacting with the opening 13 and its chamfered edge 12 provide all of the functionality of the guiding and securing mechanisms of the lower bracket, as well as that of the locking assembly. The interaction of the locking stud 40 and its ratcheting mechanism 41 with the opening 13 and its chamfered edge 12, without the use of another securing device, are within the scope of the present invention.

Another preferred embodiment of the present invention is illustrated in FIG. 3. In FIG. 3, the upper bracket portion 20 is depicted with guidance holes 21 and, disposed therein, grommets 22. Additionally, the upper bracket portion 20 further comprises guiding wings 23, designed to direct the module 10 in the sideways direction during insertion. While guiding wings 23 are illustrated in FIG. 3, other guidance mechanisms could be used instead, for example, rails or grooved tracks. The upper bracket portion 20 is rigidly secured to a base member 100. The lower bracket portion 30 shown in FIG. 3 includes two ramp assemblies 31 and two locking studs 40 to interact with the module 10 (not shown in FIG. 3). The lower bracket portion 30 is also rigidly secured to the base member 100. In the preferred embodiment, the base member 100 is the dash gusset of an automobile. A description of how the module 10 is inserted into the docking station is below.

Insertion Process

Figure 4:
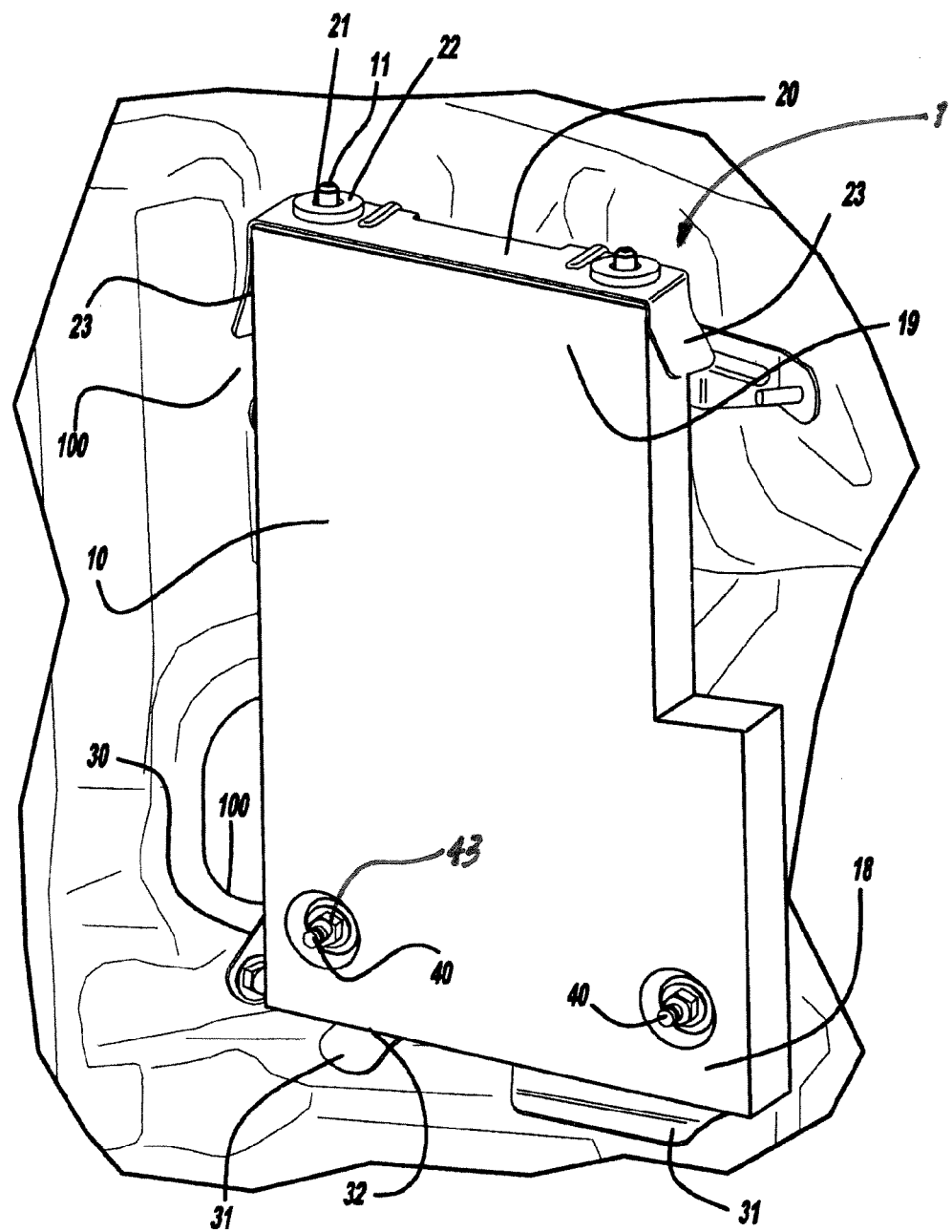
FIG. 4 is an illustration of the process of inserting the module into the docking station, according to one embodiment of the present invention.

The module 10 is inserted in the docking station 1 in a very simple manner and will be discussed with regard to FIG. 4. In FIG. 4, an installer 50 first inserts the module into the upper bracket portion 20 of the docking station 1. In the preferred embodiment, this includes inserting the guiding studs 11 into grommets 22 disposed within the guidance holes 21. The guiding wings 23, illustrated in FIG. 3, assist in directing the top portion 19 of the module 10 into the upper bracket portion 20. The guiding wings 23 are especially useful for assisting with the installation of the module 10 where there is a limited amount of available space around the docking station 1. In such a confined space, the guiding wings 23 and guidance holes 21 with grommets 22 provide the necessary precision for inserting the module 10 into the proper fixed position within the docking station 1. The grommets 22, preferably made of a rubber-like material, provide two key benefits over just using guidance holes 21: (i) they allow constrained movement of the top portion 19 of the module 10, and (ii) reduce noise, vibration and harshness.

Once the top portion 19 of the module is in its secured position, the installer 50 then directs the module 10 in the direction of arrow 60 and into the final fixed position. The grommets 22, being of a flexible material, allow the small amount of movement of the top portion 19 of the module 10 required for pivoting the module 10 into its fixed position. The ramp assembly 31 directs the lower portion 18 of the module 10 upwards during final insertion. In one embodiment, the retaining lip 32 secures the lower portion 18 of the module 10 when it reaches the fixed position. In a preferred embodiment the locking stud 40 is directed through the opening 13 during movement into the fixed position. The ratcheting mechanism 41 of the locking stud 40 interacts with the chamfered edge 12 of the opening 13 to further guide and secure the module 10 into the fixed position. Once in the fixed position, a nut 43 is screwed onto the locking stud 40 in order to lock the module 10 in its fixed position.

The foregoing discussion discloses and describes an exemplary embodiment of the present invention. One skilled in the art will readily recognize from such discussion, and from the accompanying drawings and claims that various changes, modifications and variations can be made therein without departing from the true spirit and fair scope of the invention as defined by the following claims.

What is claimed is:

1. An apparatus for securing a module, comprising:
 a first bracket member portion having a first guidance apparatus including a receptacle for receiving a first stud operatively coupled to said first end of the module and wherein said first bracket member portion includes at least one wing portion laterally positioning the module with respect to said first bracket;
 a second bracket member portion having a second guidance apparatus including a ramp;
 a retaining lip integral with said ramp for retaining the module in a fixed position; and
 a stud mounted to said second bracket member portion for fixedly securing the module to said second bracket member portion.

2. The apparatus of claim 1 wherein said first bracket member portion and said second bracket member portion are integral.

3. The apparatus of claim 1 wherein said stud includes a raised surface for interacting with the module.

4. The apparatus of claim 1 wherein said stud includes a threaded portion for receiving a nut.

* * * * *